United States Patent [19]

March

[11] Patent Number: 4,572,952
[45] Date of Patent: Feb. 25, 1986

[54] POSITION SENSOR WITH MOIRE INTERPOLATION

[75] Inventor: Adrian A. C. March, Bordon, England

[73] Assignee: Adrian March Research Ltd., Hampshire, England

[21] Appl. No.: 517,262

[22] Filed: Jul. 26, 1983

[30] Foreign Application Priority Data

Jul. 28, 1982 [GB] United Kingdom ............... 8221783

[51] Int. Cl.$^4$ .................. G01B 11/00; G01D 5/38
[52] U.S. Cl. .................. 250/237 G; 250/231 SE; 340/347 P; 356/375
[58] Field of Search .............. 250/231 SE, 237 G; 340/347 P; 356/375, 395, 373–374

[56] References Cited

U.S. PATENT DOCUMENTS

4,315,252 2/1982 Tagami ..................... 250/231 SE
4,421,980 12/1983 Kuhne ...................... 340/347 P
4,423,958 1/1984 Schmitt ..................... 356/375

Primary Examiner—Edward P. Westin
Attorney, Agent, or Firm—Larson and Taylor

[57] ABSTRACT

A position sensor has a scale consisting of tracks of indicia in the form of bar patterns acting on a detector having a two-dimensional array of sensitive elements. One track has indicia with a pitch slightly greater than the pitch of the sensitive elements and another track has indicia with a pitch slightly less than the pitch of the sensitive elements. The other tracks provide a coarse determination of the position of the scale relative to the detector while the first two tracks provide resolution of the position to less than the pitch of the sensitive elements. There is sufficient redundant information to enable accurate position detection even if there are optical or electrical perturbations in the detection of individual indicia.

11 Claims, 9 Drawing Figures

POSITION SENSOR WITH MOIRE INTERPOLATION

BACKGROUND OF THE INVENTION

1. Field of the Invention

The present invention relates to a position sensor. It is applicable both to an angular sensor detecting rotation of one body relative to another, and to a linear sensor detecting linear movement.

2. Summary of the Prior Art

A variety of devices exist which are capable of sensing the angular position of a rotating shaft. Of these, one of the most versatile is the optical shaft position encoder, having attached to the shaft a disk carrying a binary scale formed by a track of indicia from which angular position is read by an electro-optical detector disposed along the radius. The accuracy obtainable by such techniques depends on the fineness of the binary scale and the ability of the detector to resolve detail, and it is normally accepted that a division of one complete turn into $65,536 (2^{16})$ divisions represents the highest precision which can be achieved within normal dimensions by a purely binary system. Further sub-division, up to a limit of about $2^{20}$ parts in one revolution, can be achieved by adding analogue tracks in which the optical transmission varies with angular rotation in a sine or cosine manner, and using these to interpolate between the finest binary divisions. Performance to these limits of accuracy is obtainable only by using high resolution tracks formed photographically on glass disks with reading heads sensing along a radius a very narrow width of the disk, maintaining very small clearances between the reading head and the disk, and with extremely stringent limits on the eccentricity of the tracks on the disk.

Angular encoders of this type are by their very nature delicate instruments. The shock loads which they can sustain are typically less than would be expected merely from the fragility of the glass disk, since a relatively insignificant flexure of the disk permits it to strike the reading head carrying the detector. A possible solution to these problems might be to read a reflective pattern deposited on a metal disk, but the performance of such an encoder would be limited by the fineness and precision of the reflective pattern which can be formed.

Another technique which has been tried for interpolating between coarse scale divisions is to add to the scale tracks on the disk a pattern of alternate light and dark bars, of which a portion is imaged on a detector having a row of sensing elements in such a way as to generate a form of moiré fringe system similar to those developed by the use of optical gratings in combination, which is known in the design of incremental encoders. However, such attempts to use moiré fringe techniques for interpolation, as opposed to merely counting grating lines, run into a number of difficulties which are essentially associated with the small difference which has to be maintained between the pitch of the indicia formed by bars in the bar pattern image and the pitch of the sensing elements of which they fall. To achieve a useful degree of interpolation requires extremely accurate control of the optical magnification, in addition to the need to maintain a precise mechanical relationship between the interpolation system and the remainder of the encoder scale reading system. In addition, the necessary small difference between the bar pattern image pitch and the sensing element pitch leads to subdivision by factors which are inconvenient to analyse rather than, for example, a precise binary subdivision. Another problem with attempts to use this type of subdivision is that the reading of the scale prior to subdivision is typically dependent upon sensing individual edge transitions in the scale pattern. Since in many cases a speck of dirt or a hair can introduce errors in the scale reading, there is little point in performing further interpolation.

An example of such a position sensor is disclosed in German Offenlegungsschrift No. 3,150,349 in which the optical image of bar markings are imaged as a scale having a track of indicia on to a detector formed by a linear (one-dimensional) array of light sensitive elements. In order for such a system to operate satisfactorily the optical system which images the markings onto the detector must operate extremely accurately as magnification error, or radial displacement of the image would result in no or an erroneous result from the detector.

SUMMARY OF THE INVENTION

The present invention seeks to provide a position sensor in which at least some of the problems of the prior art can be overcome or ameliorated.

The present invention proposes use of a detector having a two-dimensional array of sensitive elements. The use of such an array permits inter alia the detector to detect the indicia of the track(s) of the scale even if the movement of those indicia does not coincide exactly with the lines of sensitive elements.

Preferably the scale has at least two tracks, the pitch of the indicia of one of which is between one and two times (preferably $n/n-1$ (where n is an integer greater than 2) of) the pitch of the sensitive elements and the pitch of another of the tracks is less than (preferably $n/(n+1)$ of) the pitch of the sensitive elements. The outputs of the sensitive elements detecting these two tracks produce two signal envelopes with a phase difference from which the relative positions of the scale and the detector can be derived.

The scale may have other tracks providing a more coarse position detection. A series of tracks with indicia with pitches which are integral multiples of the pitch of the sensitive elements may be provided as in known position sensors, or a track with a computer produced pseudo-random multiple of the pitch of the sensitive elements which may provide coarse positional information, with the other track(s) providing resolution to less than the pitch of the sensitive elements.

The scale may be formed from the reflected or transmissive optical image of bar markings on a disc of e.g. metal or glass. Unlike conventional encoders using binary scales, extremely fine detail may be avoided or alternatively scales of very small physical size may be used.

If two scales moving independently act on a common detector, then the relative positions of the two scales may be determined irrespective of the position of the detector by obtaining the position of each scale relative to the detector then subtracting one result from another.

Using a position sensor according to the present invention to detect the relative positions of scale and detector at regular intervals, the data obtained may be used to predict the future positions.

BRIEF DESCRIPTION OF THE DRAWINGS

Embodiments of the invention will now be described by way of example with reference to the accompanying drawings, in which.

DETAILED DESCRIPTION

Figure 1:
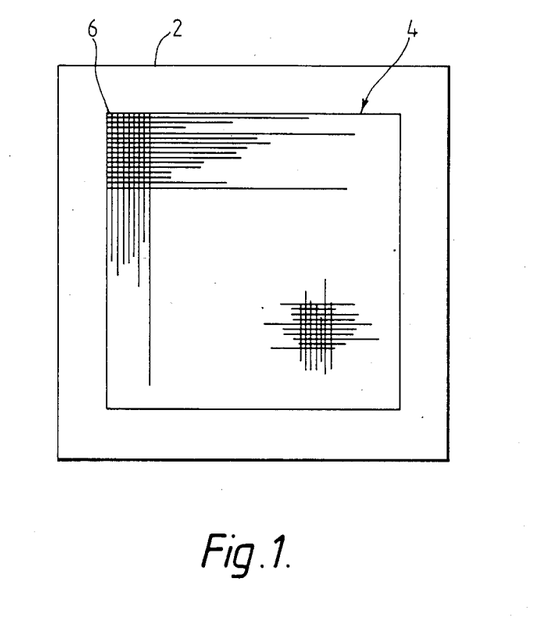
FIG. 1 is a representation of a typical solid state area array detector of a type suitable for use in the application of the invention.

Referring now to FIG. 1, this represents a diagrammatic illustration of a conventional CCD (Charge Coupled Device) or CID (Charge Injection Device) array of the type used in solid state television cameras. Typically, it consists of a detector formed by a silicon die 2 (conventionally a "chip") having on its front surface a rectangular array 4 consisting of a multiplicity of sensing sites 6 which can be interrogated electrically. Such sensing sites are customarily referred to as pixels. The device is constructed according to conventional integrated circuit techniques and mounted in a normal integrated circuit package with an optical window covering the sensitive area. A typical device which may be used in the embodiment of the invention herein described will have a total of 65,536 pixels 6 arranged in a square array 4 having 256 rows with 256 sites in each row.

Figure 2:
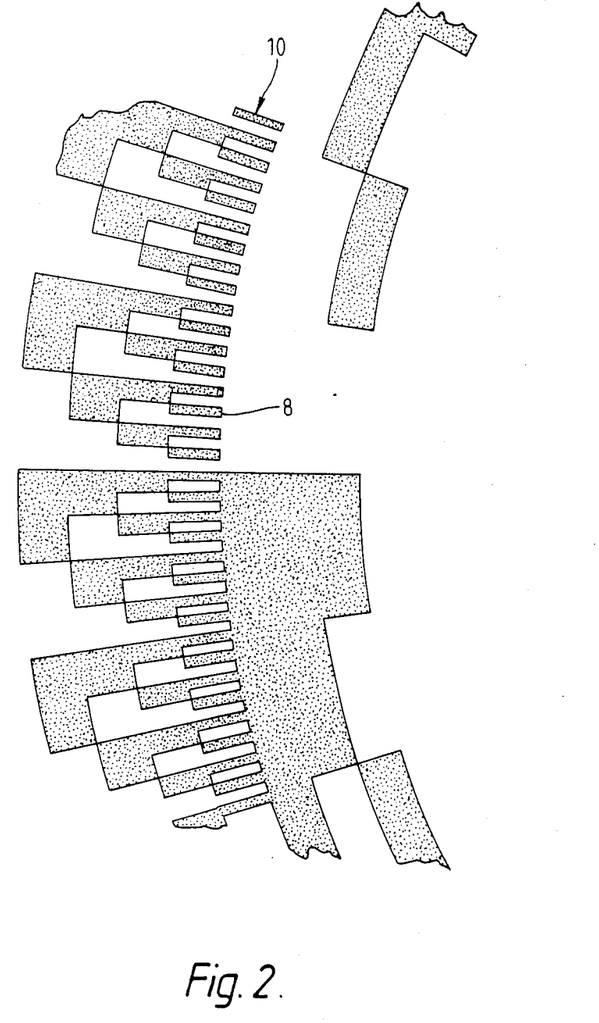
FIG. 2 is an illustration of a typical binary coded angular position scale.

It will be evident that if a portion of the binary scale of indicia illustrated in FIG. 2 is imaged on an area array detector in such a way that one division 8 of the least significant bit (LSB) track 10 spans an appropriate number of pixels along a row on the detector, and if the edge transitions of the said LSB track 10 are identified on the detector to the nearest pixel then it is possible to use the pixels on the detector to interpolate within the said LSB division 8. However, the practical problem encountered with this technique is that it requires an inconveniently high optical magnification, which must be accurately maintained. In addition, unless the degree of sub-division were sacrificed, and a significant number of divisions 8 of the LSB track 10 were imaged on one row of the detector, such a design would, like a conventional optical encoder, suffer from the disadvantage of giving an erroneous reading should a piece of dirt or a faulty pixel coincide with the edge of a scale division.

Both of these disadvantages are overcome by the interpolation system of the present invention, which makes use of the moiré fringes produced when indicia formed by a bar pattern are imaged on to an array of discrete pixels in such a way that the pitch of the indicia is almost, but not quite, equal to the pitch of the pixels.

Figure 3:
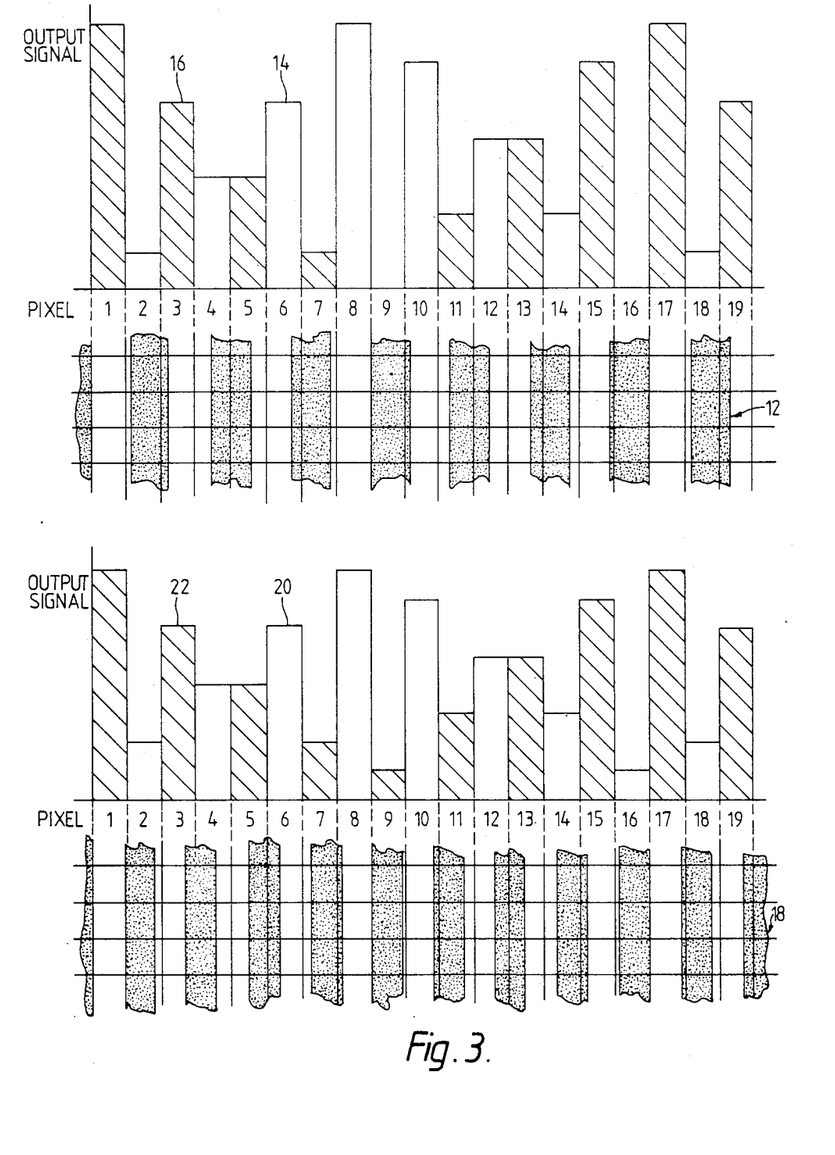
FIG. 3 illustrates the output signals obtained from a detector when bar patterns are imaged on it having spacings respectively greater and lesser than the pitch of the pixels on the detector.

The principle of operation is illustrated in FIG. 3. The top portion shows a pattern 12 of light and dark bars (each bar being an indicium) so proportioned that seven line pairs (each line pair therefore being two indicia) cover sixteen pixels. The resultant output signals from the individual pixels are shown in the form of a histogram immediately above, from which it will be seen that the signals from even-numbered pixels correspond to a triangular rising and falling waveform 14, while the signals from odd-numbered pixels represent a corresponding waveform 16 in antiphase. Both waveforms have a 16 pixel repeat distance. As the bar pattern image is moved across the detector, the output signal waveforms move in the reverse direction: a movement through exactly one line pair of the bar pattern 12 will correspond to a movement of sixteen pixels of the phase of the output waveforms 14 and 16. Unfortunately, since one line pair on the sensor corresponds to a distance of 2 2/7 pixels, it is apparently impossible by this means to sub-divide the bar pattern 12 by a simple factor.

The solution to this difficulty lies in the use of two different moiré fringe patterns. Referring to the lower half of FIG. 3, it will be seen that a bar pattern image 18 having nine line pairs (lp) equivalent to 16 pixels gives rise to output waveforms 20 and 22 very similar to those generated by the bar pattern previously discussed, albeit with a slightly reduced output amplitude. In this case, however, the ouput waveforms 20 and 22 move in the same direction as the bar pattern 18, covering one repeat distance (16 pixels) for one line pair movement (1 7/9 pixels) of the bar pattern. Again, considered in isolation, no simple sub-division of the bar pattern image 18 appears possible.

Now consider the relative behaviour of the output waveforms 14,16 and 20,22 when the two bar patterns 12 and 18 having different pitches, are imaged on different portions of the detector and move simultaneously:

For the bar pattern 12: 7 lp=16 pixels, hence 1 lp=2 2/7 pixels

For the bar pattern 18: 9 lp=16 pixels, hence 1 lp=1 7/9 pixels

If then the bar pattern images 12 and 18 move through a distance of n pixels on the detector, bearing in mind that the moiré pattern waveforms 20 and 22 move in opposite directions, the phase difference between the said waveforms will change by X pixels where:

$$X = 16\left(n \div 2\tfrac{2}{7}\right) + 16\left(n \div 1\tfrac{7}{9}\right)$$

$$= 16\left(n \cdot \tfrac{7}{16}\right) + 16\left(n \cdot \tfrac{9}{16}\right)$$

$$= (7 + 9)n$$

hence X=16n

It will be seen that although the motion of each moiré pattern waveform individually bears an awkward relationship to the movement of the image producing it, the phase difference between them varies by a convenient multiple. This makes it possible to analyse the waveform movement by digital rather than analog circuitry. In practice, since the individual triangular waveforms 14,16,20,22 are derived from alternate pixels, the system described would provide direct interpolation to ⅛ pixel, rather than the 1/16 which the arithmetic would at first glance suggest.

In the general case, if we have two bar patterns corresponding respectively to:

(n−1) line pairs = 2n pixels
and
(n+1) line pairs = 2n pixels
interpolation is achieved to 1/n pixel.

A very significant practical advantage in the use of the two bar patterns, is that changes in the optical magnification cause opposite changes in the wavelengths of the moiré fringes produced by the two patterns. The result is that a magnification variation of approximately + or −3.5% can be tolerated by the system described, whereas a single moiré pattern interpolation system using only one bar pattern 18 could tolerate no more than + or −0.7% variation in magnification. Where higher degrees of interpolation are required, the difference becomes even more significant, and a single moiré pattern would be virtually unusable without an automatic magnification control—a most unwelcome complication in a practical instrument.

Determination of the phase of the moiré pattern waveforms is performed by correlation with a reference waveform, varying the phase of the reference systematically until the best correlation is obtained. Details of the processing technique can vary widely, and will be familiar to those skilled in the art. In the simplest embodiment, each waveform is reduced by comparison of adjacent pixels to 1 bit binary form, and compared with a reference square wave generated by a counter, although in circumstances in which it is practicable to store both moiré pattern waveforms in analog form, it is possible directly to establish the phase shift which yields the best correlation of the two waveforms with each other.

A further refinement is to store the values of the moiré waveforms corresponding to each pixel in digital form. It then becomes practicable to combine signals from the even numbered pixels, with signals from odd numbered pixels having the appropriate 180 degrees phase difference, in such a way as to make use of all the signals in a single waveform. It is also entirely practicable to compute signal values intermediate between those stored for discrete pixel positions, in order to give the effect of a reference waveform displaced by a fraction of a pixel spacing. In this way, the phase difference between the two moire waveforms can be established to within a small part of a pixel, the ultimate accuracy being determined principally by signal to noise ratio considerations.

It will be apparent that with the facility to perform direct interpolation which may typically be to 1/128 ($2^{-7}$) or 1/256 ($2^{-8}$) of a pixel, the LSB can be a fairly substantial unit. It then becomes practicable for each cycle of the LSB track, instead of representing one cycle of a square wave, to contain one repeat of a pseudo-random binary pattern. Such a pattern could typically occupy virtually the full width of the detector, and the position on the detector would be determined to the nearest pixel by correlation of the signal from the detector with a reference pattern stored digitally in a ROM (read only memory). By making use of a high degree of redundancy in both pattern edges and pixels, substantial immunity is obtained to blemishes and dirt on both the scale and the detector. Additionally, in a practical encoder, a number of simple binary MSB tracks may be required to indicate which particular repeat of the LSB pattern is on the sensor at any given instant. Again, because the precise position of the LSB pattern has been determined, the expected positions of the transitions on the MSB tracks will be known; even though these positions may be obscured by contamination, a simple "voting" technique applied to the regions of the MSB tracks imaged on the detector will enable a correct MSB reading to be obtained.

Figure 4:
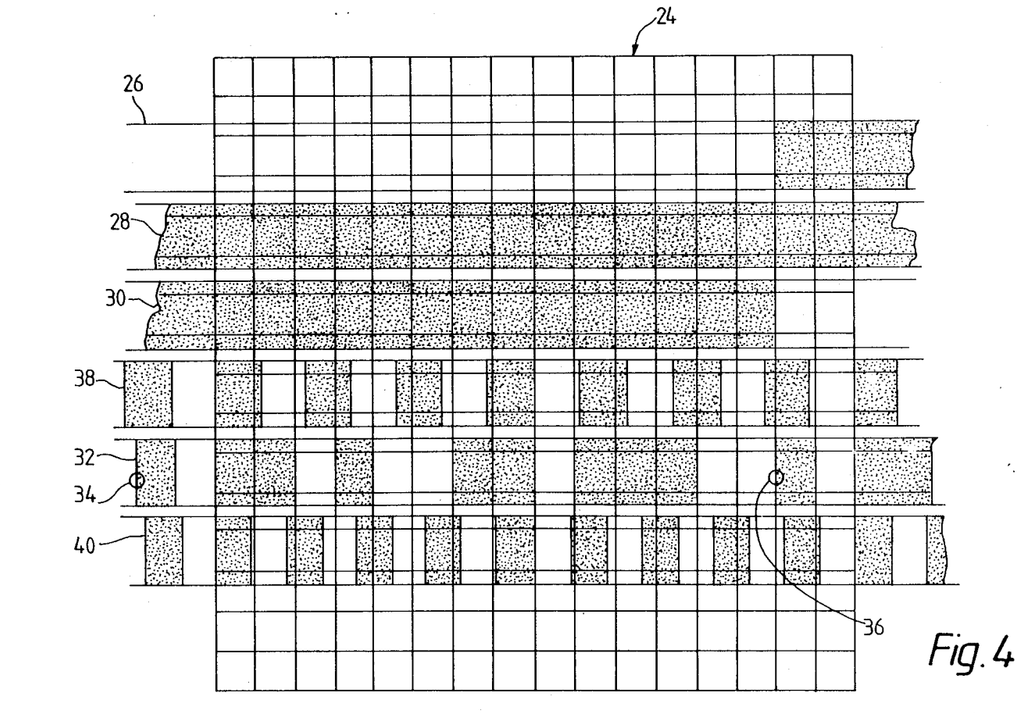
FIG. 4 represents the image on an area array detector of a position scale designed in accordance with the present invention.

By way of example, FIG. 4 illustrates an example of the invention applied to the design of a simple encoder. A hypothetical and very simple detector 24 has been assumed, having a 16×16 pixel array, and therefore affording the same interpolation performance as was illustrated in FIG. 2. For simplicity, the diagram is drawn to represent a linear encoder, although it will be evident that it could apply equally to a circular scale, provided that the curvature was not so great in relation to the size of the detector that a pixel row could not remain within the confines of its particular track. The scale which is shown imaged on the detector 24 consists of 3 coarse binary tracks 26,28,30 serving to identify the approximate position of the LSB track 32, which consists of a pattern repeating every 16 pixels as, for example, between the points 34 and 36. The other two tracks 38,40 which are conveniently, but not necessarily, situated either side of the LSB track 32, are the bar patterns required for the sub-element interpolation system, and correspond to the bar patterns 12,18 of FIG. 3.

The purpose of the repeating pattern 34–36 in the LSB track 32 is to enable the position on the detector 24 of the said pattern 34–36 to be determined by correlation, in a known manner, of the signal from the detector 24 produced by the LSB track 32 with a stored reference waveform. In this way no single edge transition on the LSB track 32 is critical, and the accuracy of its position determination to the nearest pixel will be substantially unaffected by dirt or blemishes on either the scale or the detector. It will be evident that the interpolation tracks 38,40 which, as has been explained in connection with FIG. 3 enable interpolation to be performed to ⅛ of a pixel, become completely valueless if the position of the LSB track 32 cannot be identified with certainty to the nearest pixel.

The resolution obtainable with the arrangement illustrated would be as follows:

| | |
|---|---|
| 3 MSB Tracks (26,28,30) | 3 bits resolution |
| 1 LSB Track (32) | 4 bits |
| 2 Interpolation Tracks (40) | 3 bits |

It will be seen that a resolution of 10 bits (1024 parts) has been obtained from a design having only 6 tracks and 96 active pixels; moreover, the accuracy is not dependent on the precision of any individual scale division, and the performance of the device would be unaffected by the failure of up to 4 or 5 pixels in each active row.

Figure 5:
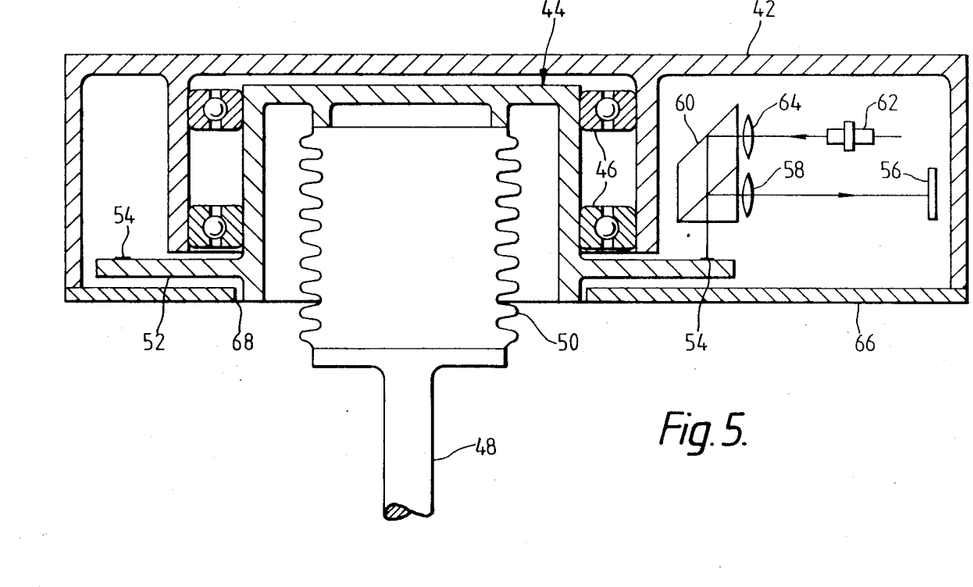
FIG. 5 is a diagrammatic cross-section of one embodiment of an angular position encoder in accordance with the present invention.

A practical embodiment of an encoder using the reading scheme represented in FIG. 4 is illustrated in FIG.

5, in which the main body of the encoder 42 carries a rotating hub assembly 44 supported by a pair of ball journal bearings 46. The abutments which would normally be used to locate the bearings have been omitted for clarity. The hub assembly 44 is driven from the shaft 48 whose angular position is to be determined, through a flexible coupling 50, in order not to transmit stresses which would affect the accuracy of the angular position reading. Mounted on the hub assembly 44 is a metal disk 52, near whose rim at the position indicated by 54 is formed a pattern of bar markings relating to angular position. A magnified image of the bar markings 54 is formed on the detector array 56 by means of the lens 58 and the splitter block 60. Illumination is provided by the gallium arsenide diode 62 in conjunction with the lens 64 and the block 60. The instrument is completed by a cover 66 which may have a dust seal (not shown) at the position 68 where it is adjacent to the hub assembly 44. This embodiment uses a reflected image of the bar markings 54.

Although for simplicity FIG. 5 shows only one optical system and detector, which would conventionally be called the reading head, it will be realised that two reading heads at opposite ends of a diameter may be employed in a manner well known in scientific instruments in order to reduce errors arising from eccentricity of the scale on the disk. Other multiple arrangements of reading heads are also possible should a particular application warrant it.

Figure 6:
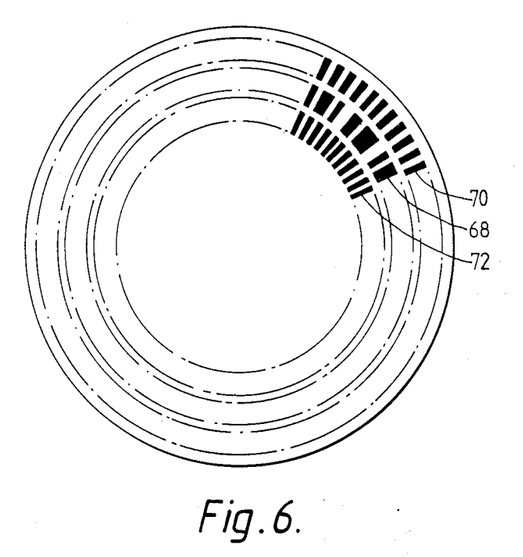
FIG. 6 represents an alternative form of angular scale in which the entire scale is intended to be imaged on the detector.

It is a feature of the present invention that the greater the number of pixels in a detector row, the smaller the fraction of a pixel to which the position of the scale image can be determined. It follows, therefore, that with sufficient pixels in the row the resolution of the system may be sufficient to dispense with MSB tracks, and to use no more than an LSB track and two bar pattern interpolation tracks. An arrangement of this nature has an obvious application to an angular encoder, in which the LSB track would consist of a single circular pattern. Such a pattern might well be computer generated as a pseudo-random number, and subsequently checked to ensure that a satisfactory correlation with the reference occurs only at a unique position. FIG. 6 illustrates a possible design for a scale of this type, in which the LSB track 68 consists of 1024 divisions, each of which is either light or dark in accordance with the said psuedo-random sequence. The outer track 70 consists of 1026 divisions alternately light and dark, and the inner track 72 consists of 1022 alternately light and dark divisions. The two bar pattern tracks 70,72 correspond in function to the bar patterns 12,18 of FIG. 3. For simplicity, only a portion of each track has been drawn.

Figure 7:
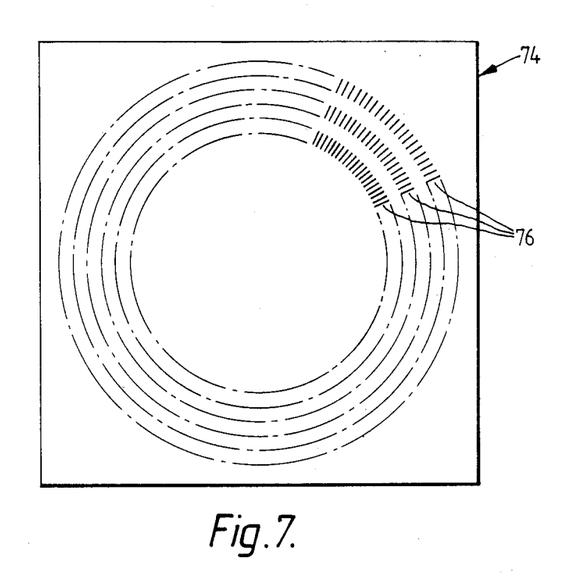
FIG. 7 illustrates the design of a type of circular detector intended for use in conjunction with the scale shown in FIG. 6.

The scale of FIG. 6 would operate in conjunction with a special detector of the type shown diagrammatically in FIG. 7, on which its image would be projected. The detector 74, instead of a rectangular array would have three concentric rings 76, each consisting of 1024 pixels. Again, only a few pixels in each ring have been drawn. Simple recognition of the LSB pattern 68 to the nearest pixel will serve to divide the complete circle into 1024 ($2^{10}$) parts; following this, the two bar patterns 70,72 in conjunction with the inner and outer circles of pixels 76 on the sensor 74 will enable a further subdivision to 1/512 ($2^{-9}$) of a pixel to be achieved. It will be seen that an apparently simple system such as this, using a scale having only 3 tracks and 3 rings of pixels, is nevertheless capable of dividing a circle into over half a million ($2^{19}$) parts. Additionally, it will be evident that the magnification of the optical system is not critical provided only that the images of the three tracks 68,70,72 cover their three respective pixel rings 76. A further benefit of the design is that for small perturbations the effects of eccentricity of the scale relative to its axis of rotation, or of the rotation axis relative to the detector, are inherently eliminated by the correlation processing.

There is, in practice, no reason why a circular scale of the type illustrated in FIG. 6 should not be imaged on a conventional area array detector. There will only be four regions on the sensor where the pixels are aligned radially and tangentially relative to the scale, but nevertheless a degree of resolution can be obtained which is likely to be sufficient for many applications.

Figure 8:
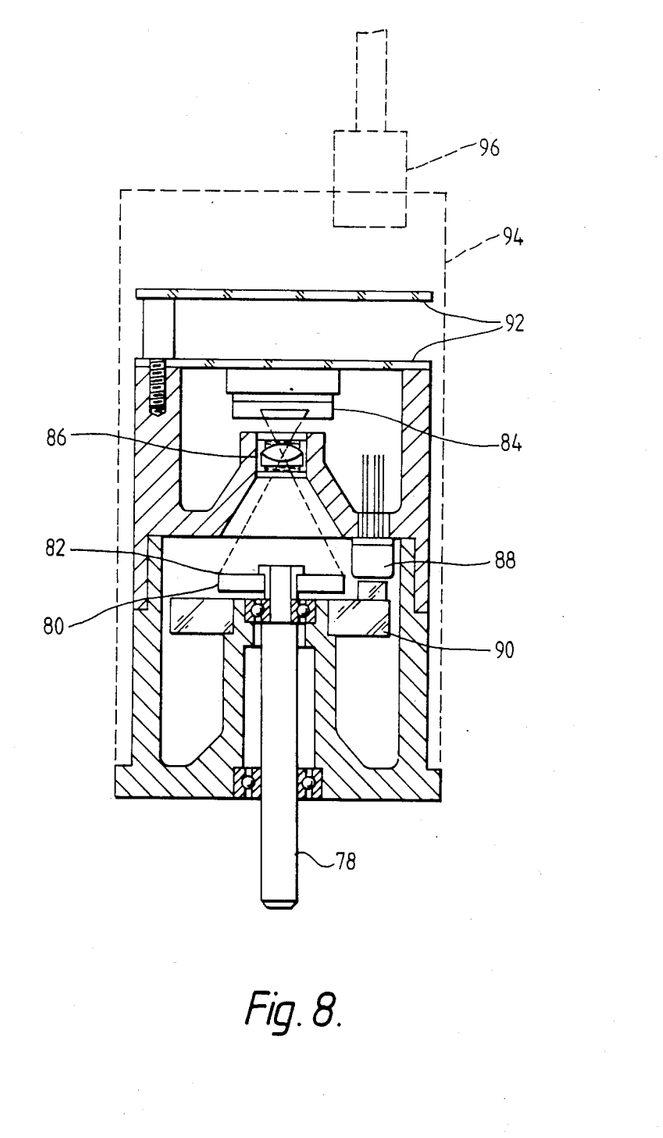
FIG. 8 represents a diagrammatic cross-section of another embodiment of angular position encoder in accordance with the present invention.

A possible embodiment in a practical instrument of the scale and detector represented respectively in FIGS. 6 and 7 is illustrated in FIG. 8. The shaft 78 carries at one end a translucent opal disk 80 on which is formed a pattern of bar markings 82. An image of the bar markings 82 is formed on the detector 84 by means of the lens 86. The bar markings 82 are illuminated from the rear by means of the gallium arsenide laser 88 in conjunction with the metallized plastic light guide 90. Thus in this embodiment the scale is a transmissive image of the bar markings. At least a part of the signal processing electronics (not shown in detail) is carried on the circuit board 92 contained within the body of the instrument 94. Power and signal connections are effected through the connector 96.

Figure 9:
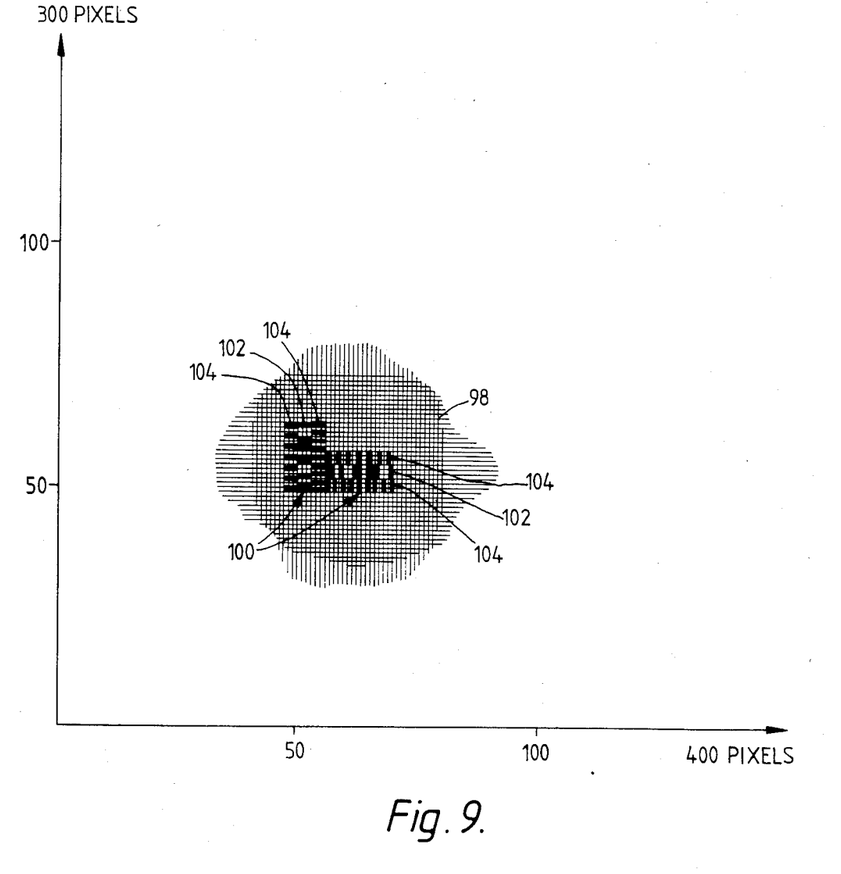
FIG. 9 is a schematic representation of the reduced image of a pair of scales designed in accordance with the present invention, on an area array detector.

Another potential application of the present invention is to locate accurately the position of a device or datum point within the field of view of a solid state camera which uses an area array detector. A possible arrangement is illustrated diagrammatically in FIG. 9, which represents a portion 98 of the picture elements on an area array detector (not shown specifically) represented by the vertical and horizontal co-ordinate axes. Two scales 100, each subtending a length of 16 pixels at the detector, are imaged on it, and each carries an LSB pattern 102 and two interpolation bar patterns 104. As was explained in connection with FIG. 3, appropriate processing of the signals from the patterns shown will enable the positions of the two scales 100 to be determined both vertically and horizontally to a precision of $\frac{1}{8}$ of a picture element. In this way, although the detector has been presumed to have only 300×400 pixels, the position of the two scales can be determined over a range corresponding to over 2300×3000 units of resolution. In addition, it will be evident that more than one scale, or pair of scales, can be in the field of view at one time, provided that they do not overlap.

Although described with reference to electro-optical detectors, and an image formed by a lens system, other embodiments and configurations are within the scope of the present invention. For example, the scale could be formed as a metallic pattern and placed in close proximity to an array of metallic pads, electrically selectable and corresponding to the pixels of the electro-optical detector. The capacitance between the two sets of electrodes would be exactly analogous to the illumination on the detector, and can be used in a similar manner to determine the scale position. Alternatively the scale could be a series of pneumatic (or hydraulic) sources and the detector a plurality of pneumatic (or hydraulic) sensing elements. The output of the sensing elements may then be analysed by pneumatic logic circuits.

What is claimed is:

1. A position sensor comprising:
    a detector having a plurality of sensitive elements extending in a two-dimensional array, adjacent sensitive elements in said detector having a first pitch therebetween;
    at least one scale having at least one track of indicia, said at least one scale being movable relative to said detector, adjacent indicia of at least part of said at least one track of indicia having a second pitch therebetween, said second pitch being less than twice but not equal to said first pitch, said indicia of at least part of said at least one track of indicia acting on sensitive elements of at least part of said two dimensional array, each sensitive element of said at least part of said two-dimensional array being adapted to detect the overlap between that sensitive element and a corresponding one of said indicia of said at least part of said at least one track, and generate an output in dependence upon said overlap; and
    means for processing said outputs of said sensitive elements in said at least part of said two dimensional array, thereby to determine the position of said at least one scale relative to said detector.

2. A position sensor according to claim 1 wherein said at least one track of indicia comprises a first track of indicia, said second pitch being less than twice but greater than said first pitch; and wherein said at least one scale has a second track of indicia, the indicia in at least part of the second track having a third pitch, and said third pitch being less than said first pitch, said indicia in said at least part of said first track acting on sensitive elements of a first part of said two-dimensional array and said indicia in said at least part of said second track acting on sensitive elements of a second part of said two-dimensional array, said sensitive elements of said first part of said two-dimensional array generating outputs forming a first signal envelope, said sensitive elements of said second part of said two-dimensional array generating outputs forming a second signal envelope having a phase difference from said first signal envelope, said means for processing said outputs of said sensitive elements determining the relative position of the detector and the scale from said phase difference.

3. A position sensor according to claim 2 wherein said second pitch is n/(n−1) times said first pitch, and said third pitch is n/(n+1) times said first pitch, where n is an integer greater than 2.

4. A position sensor according to claim 2 wherein said means for processing said outputs of said sensitive elements comprises means for generating a third signal envelope by interpolation between said outputs of said sensitive elements of said second part of said two-dimensional array with said outputs being shifted in phase to the nearest sensitive element on either side of said first signal envelope, and for comparing said first signal envelope with said third signal envelope, thereby to determine the phase difference between said first and said second signal envelopes to a fractional part of said first pitch.

5. A position sensor according to claim 2 having a further track of indicia, said indicia of said further track having a indicia pitch therebetween which is a random multiple of said first pitch.

6. A position sensor according to claim 1 having a first body and a second body, said first body having a pattern of markings thereon, said scale being an optical image of said pattern of markings, said detector being fixed relative to said second body, thereby to determine the relative positions of said first and said second body from the relative positions of said scale and said detector.

7. A position sensor according to claim 6 wherein said optical image is a transmissive image.

8. A position sensor according to claim 6 wherein said optical image is a reflective image.

9. A position sensor according to claim 1 wherein said at least one track is a circle of indicia and said two dimensional array comprises concentric rings of said sensitive elements.

10. A position sensor according to claim 1 having at least two scales, each of said at least two scales being movable independently relative to said detector, thereby to determine the relative positions of said at least two scales independent of the position of the detector.

11. A position sensor according to claim 1 having a further track of indicia, said indicia of said further track having a pitch therebetween which is a random multiple of said first pitch.

* * * * *